United States Patent
Loh et al.

(10) Patent No.: US 8,786,308 B1
(45) Date of Patent: Jul. 22, 2014

(54) METHOD AND APPARATUS FOR PROVIDING SIGNAL ROUTING CONTROL

(71) Applicant: Altera Corporation, San Jose, CA (US)

(72) Inventors: Siang Poh Loh, Sungai Petani (MY); Chooi Pei Lim, Bayan Lepas (MY); Yee Liang Tan, Bayan Lepas (MY); Kar Keng Chua, Bukit Mertajam (MY)

(73) Assignee: Altera Corporation, San Jose, CA (US)

( * ) Notice: Subject to any disclaimer, the term of this patent is extended or adjusted under 35 U.S.C. 154(b) by 72 days.

(21) Appl. No.: 13/656,479

(22) Filed: Oct. 19, 2012

(51) Int. Cl.
    *H03K 19/177* (2006.01)
(52) U.S. Cl.
    CPC ........ *H03K 19/17764* (2013.01); *H03K 19/177* (2013.01)
    USPC .............................................. 326/10; 326/38
(58) Field of Classification Search
    CPC .......... H03K 19/177; H03K 19/17764; H03K 19/17736
    USPC .......................................... 326/9, 10, 37–41
    See application file for complete search history.

(56) References Cited

U.S. PATENT DOCUMENTS

| | | | |
|---|---|---|---|
| 7,212,032 B1 * | 5/2007 | Dastidar et al. | 326/38 |
| 7,218,133 B2 * | 5/2007 | Lewis et al. | 326/10 |
| 7,508,231 B2 * | 3/2009 | Lewis et al. | 326/10 |
| 7,746,100 B2 * | 6/2010 | Lewis et al. | 326/38 |
| 8,008,764 B2 | 8/2011 | Joseph et al. | |
| 8,138,015 B2 | 3/2012 | Joseph et al. | |
| 8,395,191 B2 | 3/2013 | Or-Bach et al. | |
| 2002/0157071 A1 * | 10/2002 | Schiefele et al. | 716/6 |
| 2008/0218197 A1 * | 9/2008 | Lewis et al. | 326/10 |
| 2013/0021060 A1 * | 1/2013 | Or-Bach | 326/41 |

* cited by examiner

*Primary Examiner* — Don Le
(74) *Attorney, Agent, or Firm* — Chih-Yun Wu

(57) ABSTRACT

Integrated circuit packages with a signal routing control through a given direction are disclosed. A disclosed integrated circuit package includes a plurality of interconnects. A first logic circuitry of a first integrated circuit may produce a first signal that may be transmitted to a second integrated circuit. The integrated circuit package further includes interconnect circuitry disposed between the first and second integrated circuits. Multiplexing circuitry may select the first signal from second logic circuitry when the first logic circuitry is defective and may direct the signal as output signal to the second integrated circuit through a given interconnect.

20 Claims, 11 Drawing Sheets

METHOD AND APPARATUS FOR PROVIDING SIGNAL ROUTING CONTROL

BACKGROUND

Generally, programmable logic devices are configurable logic circuits that may be programmed to perform a variety of functions. The decrease in device dimension on such circuits promotes the incorporation of stacked elements that may enhance electronic device features and increases logic density and complexity. However, the increase of complexity in programmable logic devices may result in assembly defect that may arise during fabrication. Such defects may lower manufacturing yield.

SUMMARY

A programmable logic device with stacked components and an effective signal routing mechanism is desirable for multi-die package structures. Embodiments of the present invention include integrated circuit package structures with redundancy circuitry to accommodate defects such as manufacturing defects.

It is appreciated that the present invention can be implemented in numerous ways, such as a process, an apparatus, a system, a device, or a method on a computer readable medium. Several inventive embodiments of the present invention are described below.

An integrated circuit may include an interconnect. The integrated circuit may include a first logic circuitry operable to produce a first signal and a second logic circuitry operable to produce a second signal. The second logic circuitry may be activated into use to replace the first logic circuitry when the first logic circuitry is defective. The integrated circuit may include a multiplexing circuit operable to receive the first and second signals and to provide the interconnect with an output signal selected from the first and second signals.

A multi-chip package is provided. The multi-chip package includes a first integrated circuit with a first logic circuitry operable to produce a first signal, a second logic circuitry operable to produce a second signal that may be activated into use when the first logic circuitry is defective and a multiplexing circuit operable to produce an output signal selected from the first and second signals. The multi-chip package also includes a second integrated circuit. A plurality of interconnects is coupled between the first and second integrated circuits. A first interconnect from the plurality of interconnects may be used to transmit output signals to the second integrated circuit.

A method of operating an integrated circuit that is coupled to an external integrated circuit by a plurality of interconnects is provided. The method includes with a multiplexing circuit, receiving a signal from the external integrated circuit through a given interconnect of the plurality of interconnects. The multiplexing circuit also routes the signal to a logic circuitry selected from first and second logic circuitries on the integrated circuit.

Further features of the invention, its nature and various advantages, will be more apparent from the accompanying drawings and the following detailed description of the preferred embodiments.

DETAILED DESCRIPTION

Integrated circuits such as programmable logic devices such as programmable logic devices (e.g., programmable integrated circuits) may be provided with reserved logic regions that serve as redundancy circuitry. The redundancy circuitry may be activated to replace defective logic circuitry on the integrated circuit. Multiplexing circuitry may be used to re-route signals through the redundancy circuitry instead of through the defective logic circuitry. For example, a newly fabricated programmable logic device may be tested following device fabrication. In this scenario, multiplexing circuitry on the programmable logic device may be configured to route signals through logic circuitry on the device. If the defective logic circuitry is identified as being defective, the multiplexing circuitry may be reconfigured to route the signals through the redundant circuitry. In doing so, signal routing that uses a given interconnect to transmit signals can be maintained between the device and an external device regardless of logic circuit shifting.

Thus, it would be desirable to be able to provide an efficient signal routing control from one integrated device to another so that signal transmission can be maintained in one given direction.

The embodiments provided herein include circuitry and techniques to operate an integrated circuit that is coupled to an external integrated circuit by a plurality of interconnects.

It will be obvious, however, to one skilled in the art, that the present exemplary embodiments may be practiced without some or all of these specific details. In other instances, wellknown operations have not been described in detail in order not to unnecessarily obscure the present embodiments.

Generally, an integrated circuit device may be connected to other external circuitry such as other integrated circuit devices, memory modules, etc. and signals may travel between the integrated circuit device and the external circuitry coupled to via interconnects such as microbumps, interposer, conductive pathways, etc.

The incorporation of stacked elements in integrated circuit devices may help to increase logic density and may improve device features. For example, interconnects of first integrated circuit may be coupled to corresponding contact pads of second integrated circuit to create a pathway for signal transmission. Signals may travel from the first integrated circuit to the second integrated circuit through the assigned signal pathway. However, manufacturing defects during fabrication may cause the microbump assignments to be broken.

Figure 1:
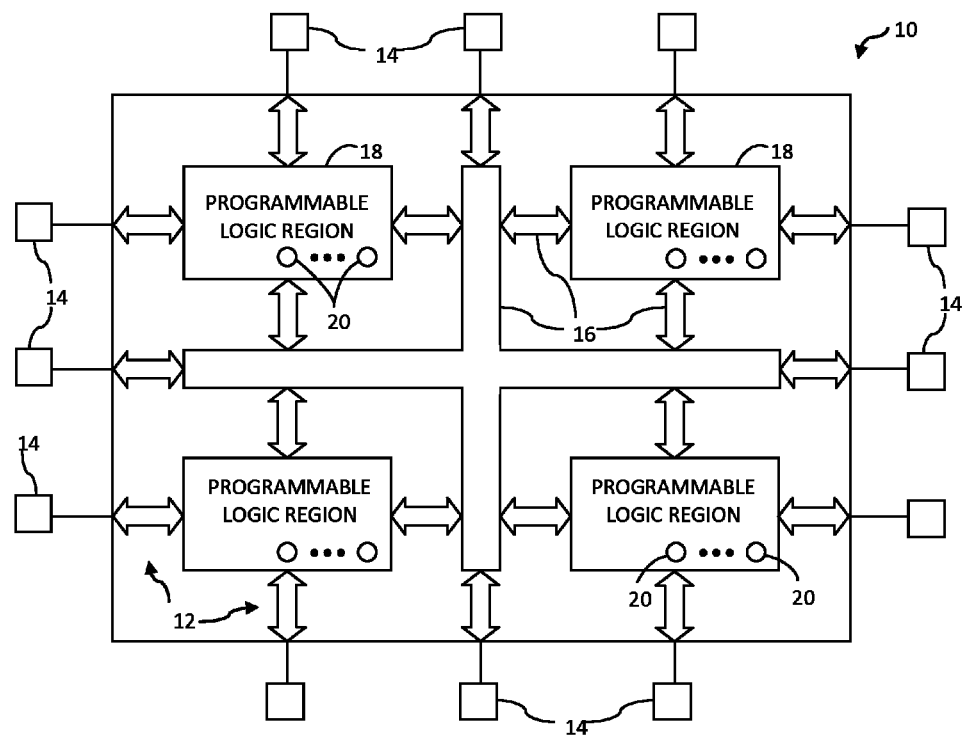
FIG. 1 is a diagram of an illustrative integrated circuit in accordance with an embodiment of the present invention.

FIG. 1 is a diagram of an illustrative integrated circuit 10 in accordance with an embodiment of the present invention. Programmable integrated circuit 10 may have input/output circuitry 12 for driving signals off of integrated circuit 10 and for receiving signals from other circuits or devices via input/output pins 14.

Interconnection resources 16 such as global and local vertical and horizontal conductive lines and busses may be used to route signals on device 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic 18.

Memory elements 20 may be formed using complementary metal-oxide-semiconductor (CMOS) integrated circuit technology (as an example). In the context of programmable logic device integrated circuits, the memory elements store configuration data and are therefore sometimes referred to as configuration random-access memory (CRAM) cells. In general, configuration random-access memory elements 20 may be arranged in an array pattern. In a programmable logic device, there may be millions of memory elements 20 on each chip. A user (e.g., a logic designer) may provide configuration data for the array of memory elements during programming operation. Once loaded with configuration data, memory elements 20 may selectively control (e.g., turn on and off) portions of the circuitry in programmable logic region 18 and thereby customize its functions as desired.

The circuitry of programmable logic device 10 may be organized using any suitable architecture. For instance, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

When memory elements 20 are arranged in an array, horizontal and vertical conductors and associated control circuitry may be used to access the memory elements 20. The control circuitry may, for example, be used to clear all or some of the memory elements. The control circuitry may also write data to the memory elements 20 and may read data from the memory elements 20. For example, in CRAM arrays, memory elements 20 may be loaded with configuration data. The loaded configuration data may then be read out from the memory array to confirm proper data capture before device 10 is used during normal operation in a system.

Figure 2:
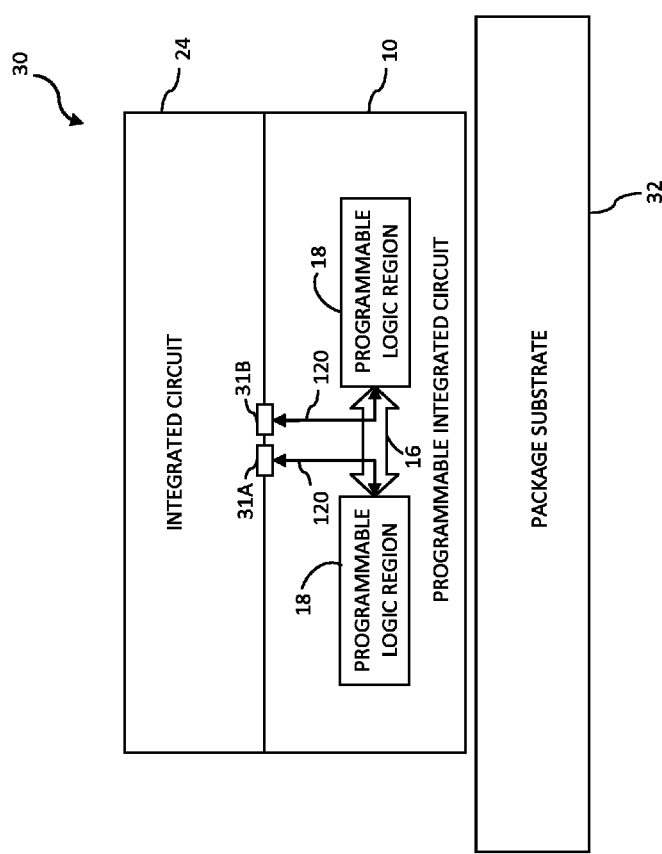
FIG. 2 is a cross-sectional view of an illustrative three-dimensional (3D) package in accordance with an embodiment of the present invention.

Integrated circuits may be stacked to form a three-dimensional (3D) package. FIG. 2 is a cross-sectional view of an illustrative 3D package 30. Package 30 may include programmable integrated circuit 10 stacked with an additional integrated circuit 24. As shown in FIG. 2, programmable integrated circuit 10 may be disposed over package substrate 32 (e.g., integrated circuit 10 may be mounted to package substrate 32). Integrated circuit 24 may be placed over programmable integrated circuit 10.

Contact pads 31A and 31B may be placed between integrated circuits 10 and 24. As an example, contact pads 31A and 31B may be formed by depositing copper or other conductive materials to form contacts on the surface of programmable integrated circuit 10. In this scenario, contact pads 31A and 31B may mate with corresponding contacts on the lower surface of integrated circuit 24 (e.g., via microbumps formed from solder, copper, or other conductive materials).

Contact pads 31A-31B may be used to convey signals between integrated circuits 10 and 24. Interconnect circuitry 120 coupled to contact pads 31A and 31B may be used to route signals from programmable logic region 18 to integrated circuit 24 through contact pads 31A-31B. Interconnect circuitry 120 may be used to route signals received from integrated circuit 24 at contact pads 31A and 31B to programmable logic region 18. Interconnect circuitry 120 may be used to route signals received from integrated circuit 24 at contact pads 31A and 31B to programmable logic regions 18. Signals may travel from one programmable logic region 18 to another through interconnects 16. As shown in FIG. 2, interconnects 16 may include portions of interconnect circuitry 120.

Figure 3:
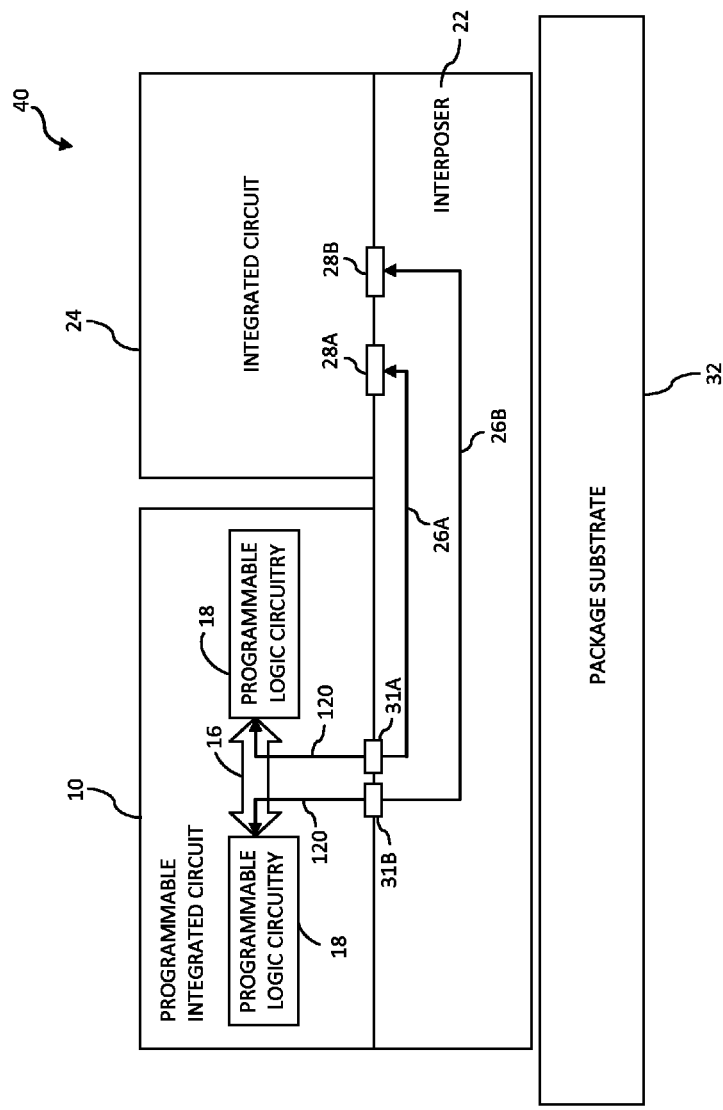
FIG. 3 is a cross-sectional view of an illustrative 2.5D package in accordance with an embodiment of the present invention.

In some scenarios, integrated circuits may be combined to form packaged circuitry using an interposer. FIG. 3 is a cross-sectional view of a package 40 in which programmable integrated circuit 10 and integrated circuit 24 are coupled to package substrate 32 via interposer 22. Packaged circuitry such as package 40 that includes interposer 22 may sometimes be referred to as a 2.5D package. It should be appreciated that for the sake of brevity, components already shown in integrated circuits 10 and 24 of FIG. 2 (e.g., programmable logic region 18, interconnect circuitry 120, and interconnects 16, contact pads 31A and 31B) and described above will not be repeated.

Integrated circuits 10 and 24 may be disposed over package substrate 32. Accordingly, interposer 22 may be placed between package substrate 32 and integrated circuits 10 and 24. Contact pads 31A and 31B of integrated circuit 10 may be coupled to respective contact pads 28A and 28B of integrated circuit 24 through interconnects 26A and 26B of interposer 22. Interconnects 26A and 26B may, for example, include traces formed on an integrated circuit substrate (e.g., a silicon substrate or other integrated circuit substrates). Interconnect paths 26A and 26B may form signal pathways for signal transmission between integrated circuit 10 and integrated circuit 24.

Figure 4A:
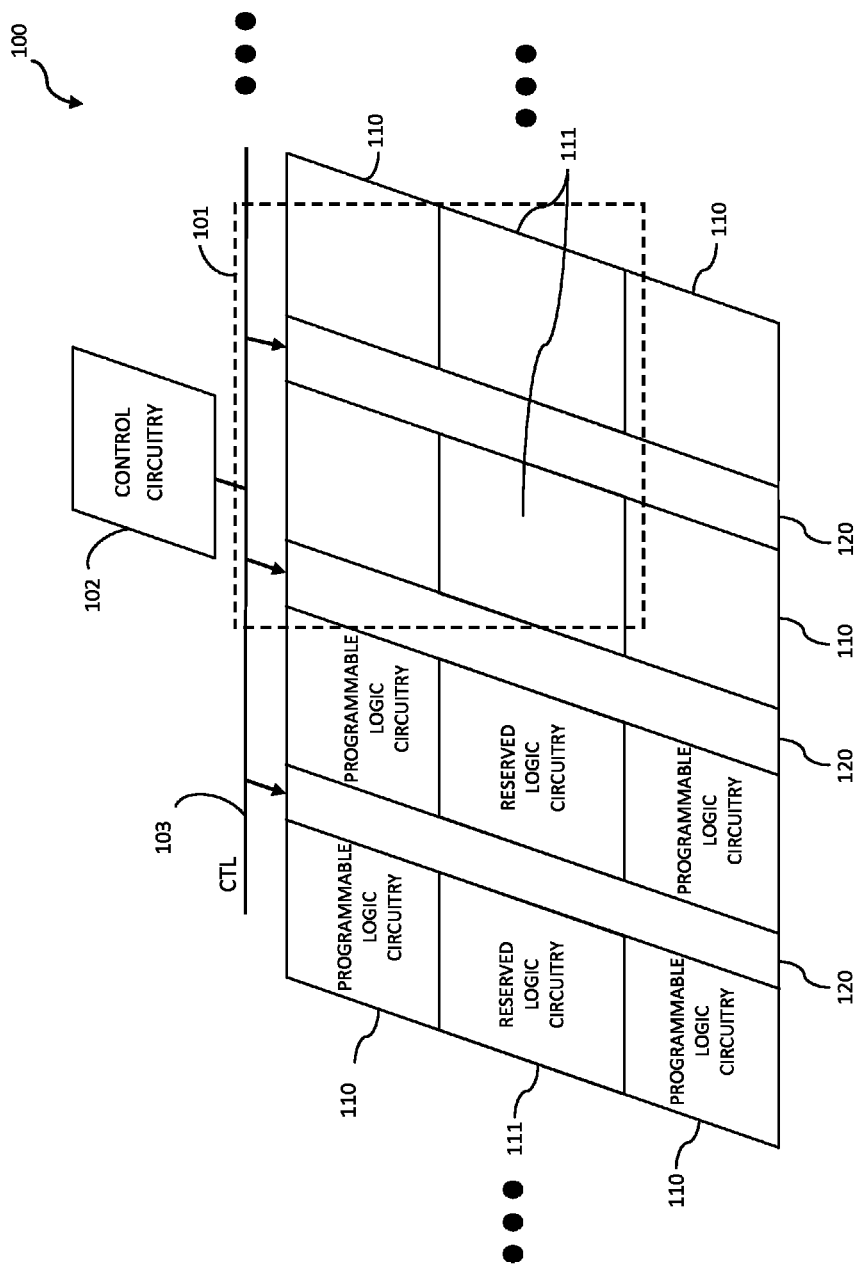
FIG. 4A is an isometric view of a simplified floor plan of an example integrated circuit with programmable logic circuitries, reserved logic circuitries, and interconnect circuitry in accordance with an embodiment of the present invention.

FIG. 4A is an isometric view of an illustrative integrated circuit 100 with programmable logic circuitries 110, reserved logic circuitries 111, and interconnect circuitry 120. Control circuitry 102 may be coupled to interconnect circuitry 120 in the peripheral region of integrated circuit 100. Control circuitry 102 may provide control signal 103 to be transmitted out to interconnect circuitry 120 via control paths.

Control circuitry 102 may store information that identifies defective logic circuitries. Control circuitry 102 may configure interconnect circuitry 120 to select output signal from the signals received from logic circuitries 110 based on the stored information. For example, reserved logic regions (circuitry) 111 may be activated into use to replace defective logic circuitries by routing input and output signals through the reserved logic regions instead of the defective logic regions. A more detailed description of programmable logic circuitry 110, reserved logic circuitry 111, and interconnect circuitry 120 will be described later with reference to circuit region 101 of FIGS. 4B and 4D.

Figure 4B:
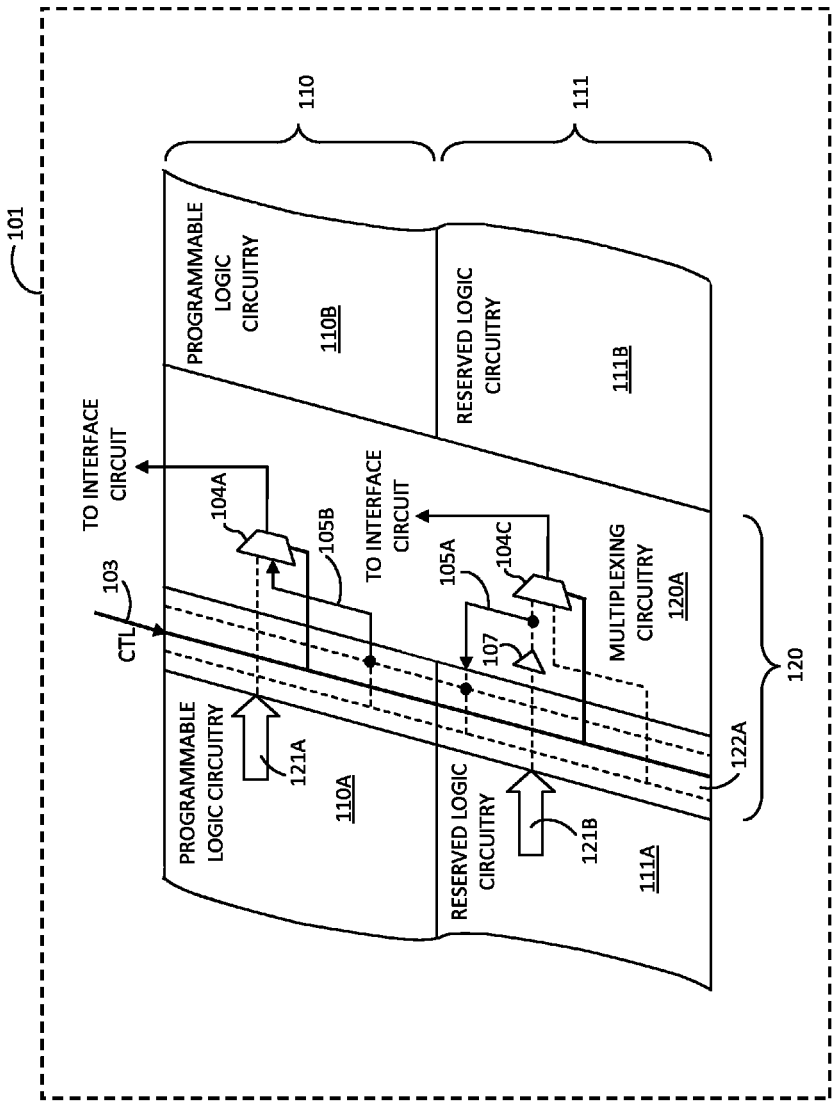
FIG. 4B is an isometric view of an illustrative integrated circuit with a multiplexing circuit receiving logic signals from the interconnect circuitry in accordance with one embodiment of the present invention.

FIG. 4B is an isometric view of an illustrative integrated circuit region 101 with a more detailed representation of programmable logic circuitries 110, reserved logic circuitries 111, and interconnect circuitry 120. In one embodiment, each of logic circuitries 110A-110B and 111A-111B may be operable to provide output signals. In the embodiment of FIG. 4B, programmable logic circuitry 110A and reserved logic circuitry 111A may produce signal 121A and signal 121B, respectively. It should be appreciated that logic circuitries 110A and 111A may receive signals from other circuitry.

Reserved logic circuitry 111A may be configured to transmit output signals provided by logic circuitry 110A when logic circuitry 110A is defective. For example, reserved logic circuitry 111B may be activated into use by control circuitry such as circuitry 102 of FIG. 4A when logic circuitry 110B is defective. It should be appreciated that even though reserved logic circuitries 111A and 111B are shown in embodiment of FIG. 4B, other logic circuitries 110 of FIG. 4A may be used as reserved logic circuitries as well. Reserved logic circuitry 11A may sometimes be referred to as redundant circuitry or redundant logic regions, because circuitry 111 provides redundant functionality to programmable logic circuitry such as 110A and 110B.

As shown in FIG. 4B, interconnect circuitry 120 may include interconnects 122A and multiplexing circuitry such as multiplexers 104A and 104C. The example of FIG. 4B in which interconnect circuitry 120 includes two multiplexers (e.g., multiplexers 104A and 104C) is merely illustrative. If desired, fewer or more multiplexers may be used depending on the required functionality of the integrated circuit.

In the embodiment of FIG. 4B, control signal 103 may be a static control signal that may be used to control multiplexing circuitry 120A in circuit region 101 of an integrated circuit. It should be appreciated that the static control signal may be provided by memory elements such as CRAM bits and may control multiplexers 104A and 104C to selectively output signals received from interconnect circuitry 120.

The output signals selected by multiplexing circuitry 120A may be transmitted to an interface circuit. It should be appreciated that the interface circuit may include contact pads, interposers, circuitry or logic elements, details of which are not shown in order to not unnecessarily obscure the present invention, that may be used to implement desired user functions. For example, the interface circuit may include integrated circuit 24 of 3D package 30 as shown in FIG. 2. As another example, the interface circuit may include an interposer such as interposer 22 in 2.5D package 40 of FIG. 3.

In one embodiment, driver circuit 107 may direct signal 121A from reserved logic circuitry 110A to the multiplexers 104A and 104B. Interconnect path 105A may be used to transfer signals driven by driver circuit 107 to the plurality of interconnects 122A.

Figure 4C:
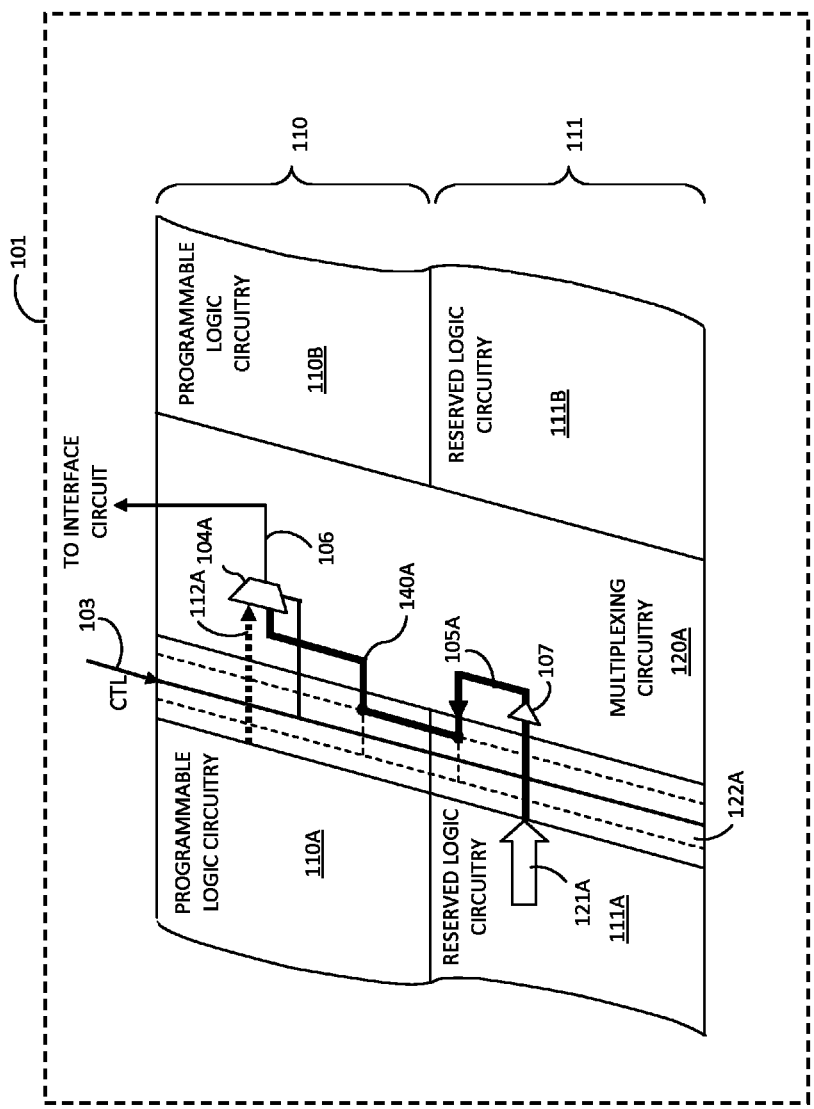
FIG. 4C is a signal transmission path of an illustrative integrated circuit region in accordance with one embodiment of the present invention.

Each multiplexing circuit 104A and 104B may be coupled to a predetermined location of the interface circuit (e.g., a contact pad on the interface circuit). Multiplexing circuits 104A and 104B may be configured to determine whether programmable logic circuitry output signals or reserved logic circuitry output signals are routed to the predetermined locations of the interface circuit. FIG. 4C depicts a signal transmission path of an illustrative integrated circuit region 101 in accordance with one embodiment of the present invention. It should be appreciated that for the sake of brevity, components already shown in the integrated circuit 101 of FIG. 4B and described above (e.g., programmable logic circuitries 110, reserved logic circuitries 111, interconnect circuitry 120, and multiplexing circuitry 120A) will not be repeated.

In the embodiment of FIG. 4C, control circuit 102 of FIG. 4A may provide control signal 103 to multiplexing circuitry 120A to reconfigure its original signal pathway 112A to a different signal pathway 140A in response to identifying defective logic circuitries. For instance, logic circuit 110A may be detected as defective. In this scenario, reserved logic circuitry 111A may be configured to perform the desired functions of programmable logic circuitry 110A and signal transmission pathway 140A may be used to route signal 121A from reserved logic circuitry to the interface circuit at the predetermined location originally associated with programmable logic 110A. It should be appreciated that even though specific configurations are shown in the embodiment of FIG. 4C, different configurations may be employed in this context.

Figure 4D:
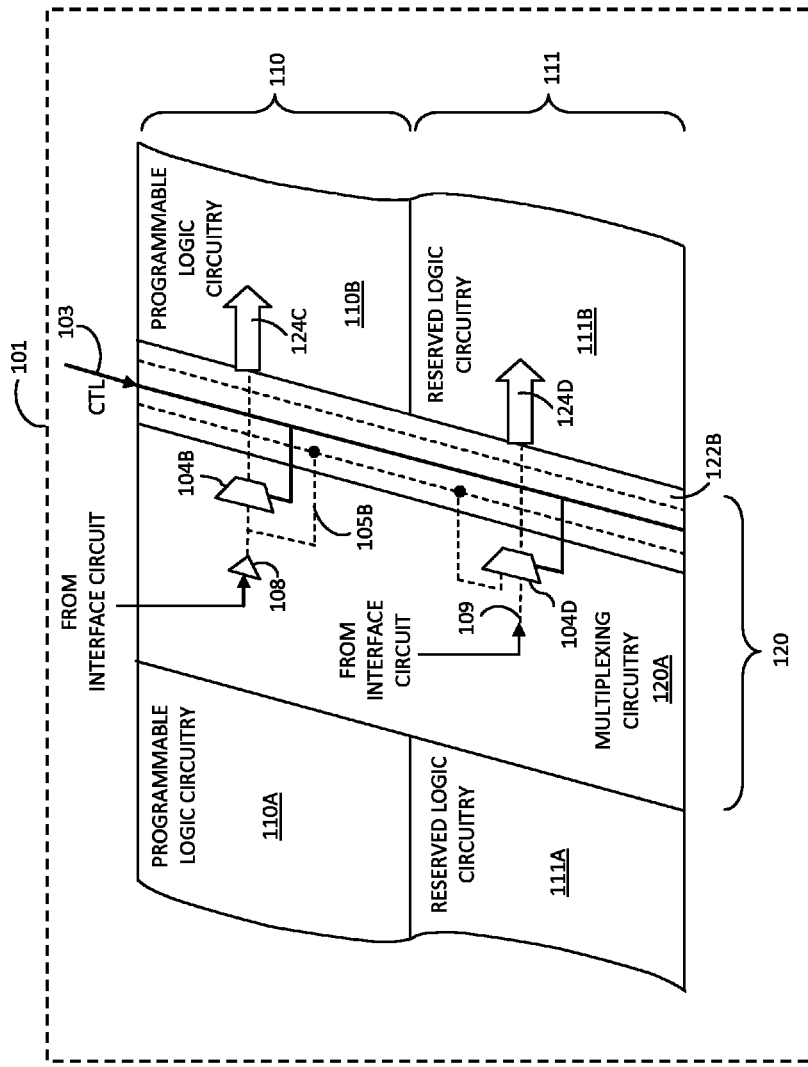
FIG. 4D is an isometric view of an illustrative integrated circuit region with circuitry receiving return signal from an interface circuitry in accordance with one embodiment of the present invention.

FIG. 4D is an isometric view of an illustrative integrated circuit region 101 with circuitry receiving signal from an interface circuitry in accordance with one embodiment of the present invention. It should be appreciated that for the sake of brevity, components already shown in the integrated circuit region 101 of FIG. 4B and described above will not be repeated.

In the embodiment of FIG. 4D, driver circuits 108 and 109 may be operable to receive input signals from a plurality of interconnects on the interface circuitry. It should be appreciated that driver circuits 108 and 109 may have similar functionality as driver circuit 104 of FIG. 4B.

In one embodiment, multiplexers 104B and 104D may be operable to receive input signals from the interface circuitry. It should be appreciated that even though two multiplexers (e.g., multiplexers 104B and 104D) are shown in the embodiment of FIG. 4D, depending on the required functionality of the integrated circuit, fewer or more multiplexers may be used.

Figure 4E:
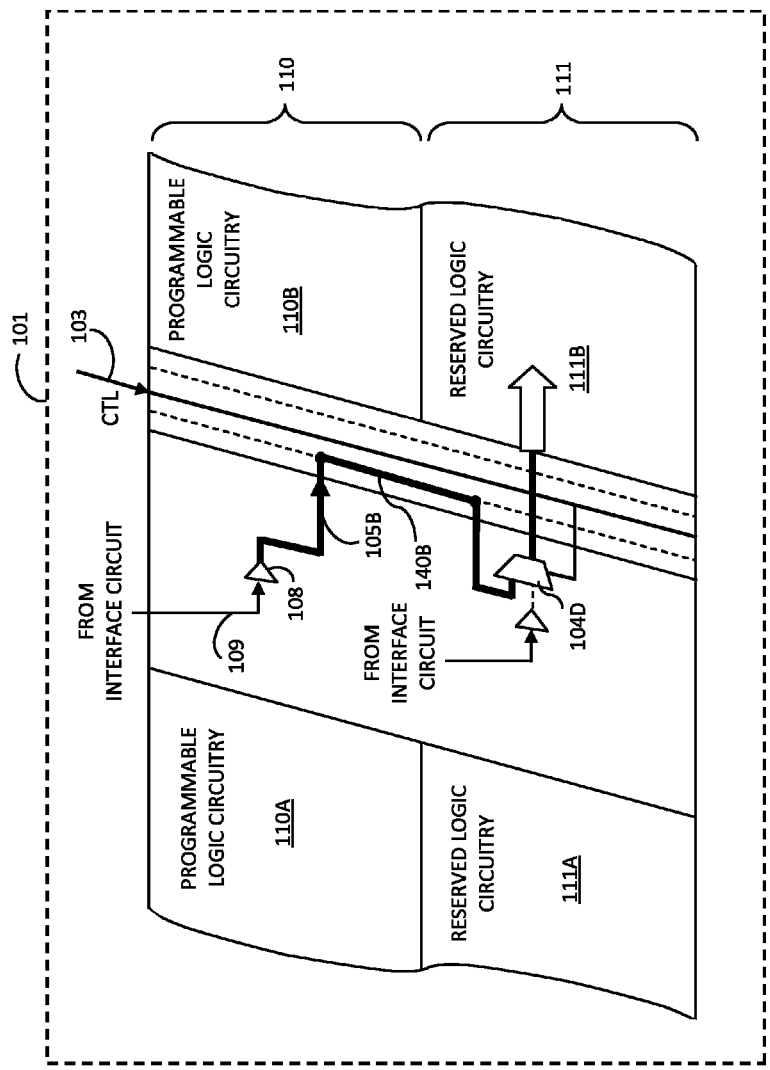
FIG. 4E is a signal transmission path of an illustrative circuit region in accordance with one embodiment of the present invention.

FIG. 4E depicts a signal transmission path of an illustrative circuit region 101 in accordance with one embodiment of the present invention. It should be appreciated that for the sake of brevity, components already shown in the integrated circuit region 101 of FIGS. 4B and 4D and described above will not be repeated. Accordingly, it should also be appreciated that signal transmission 140B shown in the embodiment of FIG. 4E may correspond to signal transmission shown in the embodiment of FIG. 4C as a return signal transmission from the interface circuitry.

In the embodiment of FIG. 4E, when programmable logic region 110B is identified as defective by control circuit 102 of FIG. 4A, signal transmission pathway 140B may used to transmit input signal 109 to reserved logic circuitry 110D. Accordingly, driver circuit 108 may transmit input signal 109 to multiplexer 104D through interconnect line 105B. In an exemplary embodiment, the transmitted control signal 103 may be operable to control multiplexer 104D to select input signal 109 to be transferred to reserved logic circuitry 110D.

Figure 5:
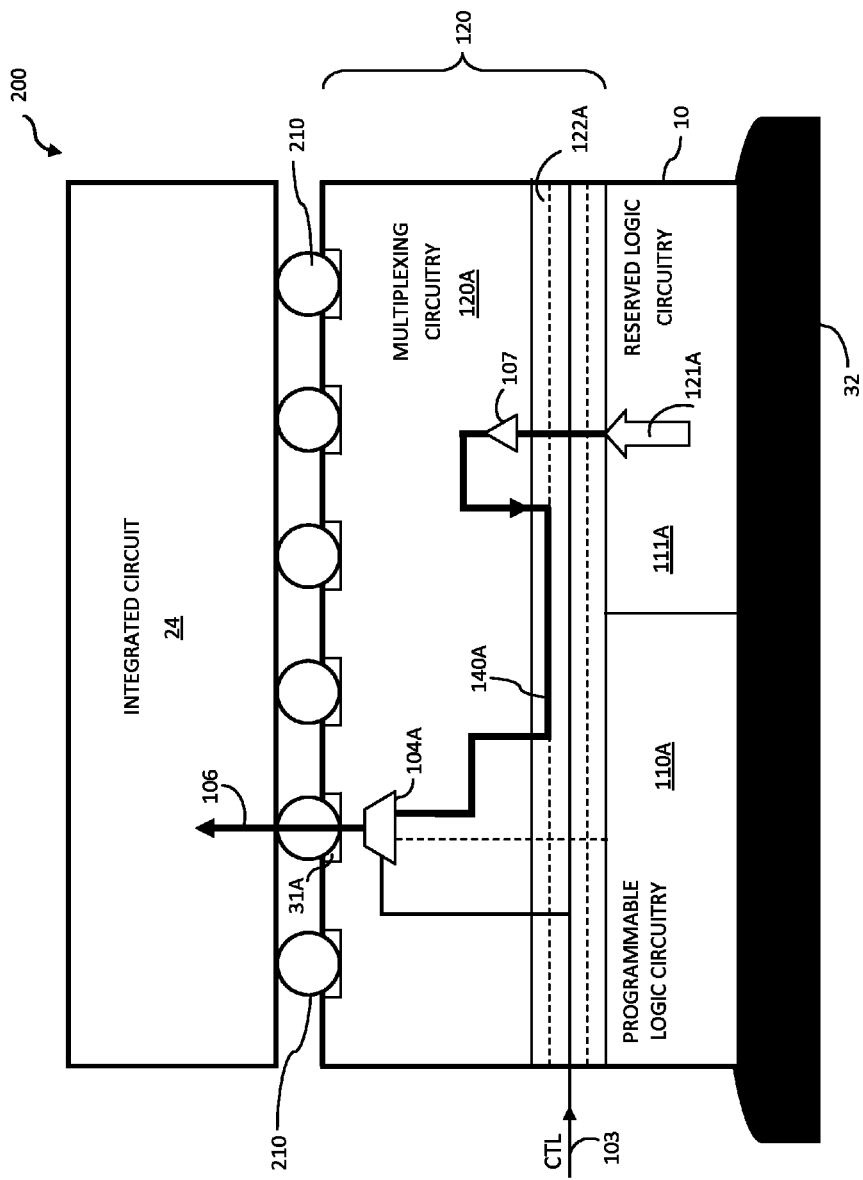
FIG. 5 is a cross-sectional view of an illustrative multi-chip package with a plurality of microbumps placed in between two integrated circuits and in accordance with one embodiment of the present invention.

FIG. 5 is a cross-sectional view of an illustrative multi-chip package 200 (e.g., a 3D package such as 3D package 30 of FIG. 2) with a plurality of interconnects 210 placed in between two integrated circuits 10 and 24 in accordance with one embodiment of the present invention. It should be appreciated that multi-chip package 200 may share similarities with 3D package 20 of FIG. 2. Accordingly, it should also be appreciated that the elements shown in the embodiment of FIG. 5 may share similarities with circuit region 101 of FIGS. 4B-4C. As such, for the sake of brevity, elements that have been describe above, such as interconnect circuitry 120, programmable logic circuitries 110, integrated circuit 24 and package substrate 32, will not be described in detail.

In the embodiment of FIG. 5, contact pad 31A may be coupled to a corresponding interconnect of integrated circuit 24. In one embodiment, contact pad 31A may be assigned as an interconnect path for signal 121A to travel from logic circuitry 110A to integrated circuit 24. Signals transmitted from logic circuitry 110A may use contact pad 31A as an output path to integrated circuit 24. In one embodiment, the interconnect assignment that includes contact pad 31A and its corresponding interconnect on integrated circuit 24 may be assigned to logic circuitry 110A for direct signal transmission. In another embodiment, logic circuitry 110C may have a different interconnect assignment when it is not being used as a reserved logic circuitry.

Figure 6:
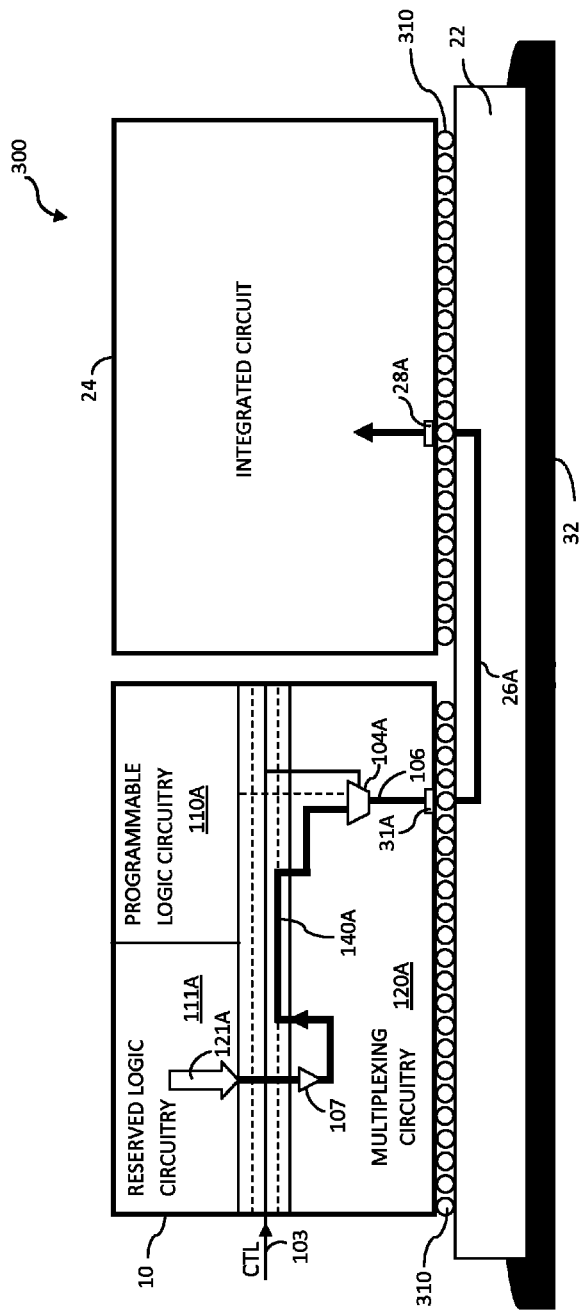
FIG. 6 is a cross-sectional view of an illustrative multi-chip package with two integrated circuits placed adjacent to one another in accordance with one embodiment of the present invention.

FIG. 6 is a cross-sectional view of an illustrative multi-chip package 300 with two integrated circuits 10 and 24 placed adjacent to one another in accordance with one embodiment of the present invention. It should be appreciated that multi-chip package 300 may share similarities with 2.5D package 20 of FIG. 3. Accordingly, it should also be appreciated that the elements shown in the embodiment of FIG. 5 may share similarities with circuit region 101 of FIGS. 4B-4C. As such, for the sake of brevity, elements that have been describe above, such as interconnect circuitry 120, programmable logic circuitries 110, integrated circuit 24, interposer 22 and package substrate 32, will not be described in detail.

In one embodiment, multiplexer 104A may select signal 121A as output signal 106. Output signal 106 may be transmitted from integrated circuit 10 to integrated circuit 24 through an interconnect path 26A. For example, when programmable logic circuitry 110A of integrated circuit 10 is detected as defective, reserved logic circuitry 111A may be activated to transmit signal 121A. Signal 121A is then directed to multiplexer 104A using driver circuit 107 through functional signal pathway 140A. Once selected, multiplexer 121A may output signal 121A as output signal 106 to contact pad 31A. In the embodiment of FIG. 6, an output path of contact pad 31A may be connected to an input path of contact pad 28A through interconnect path 26A.

Figure 7:
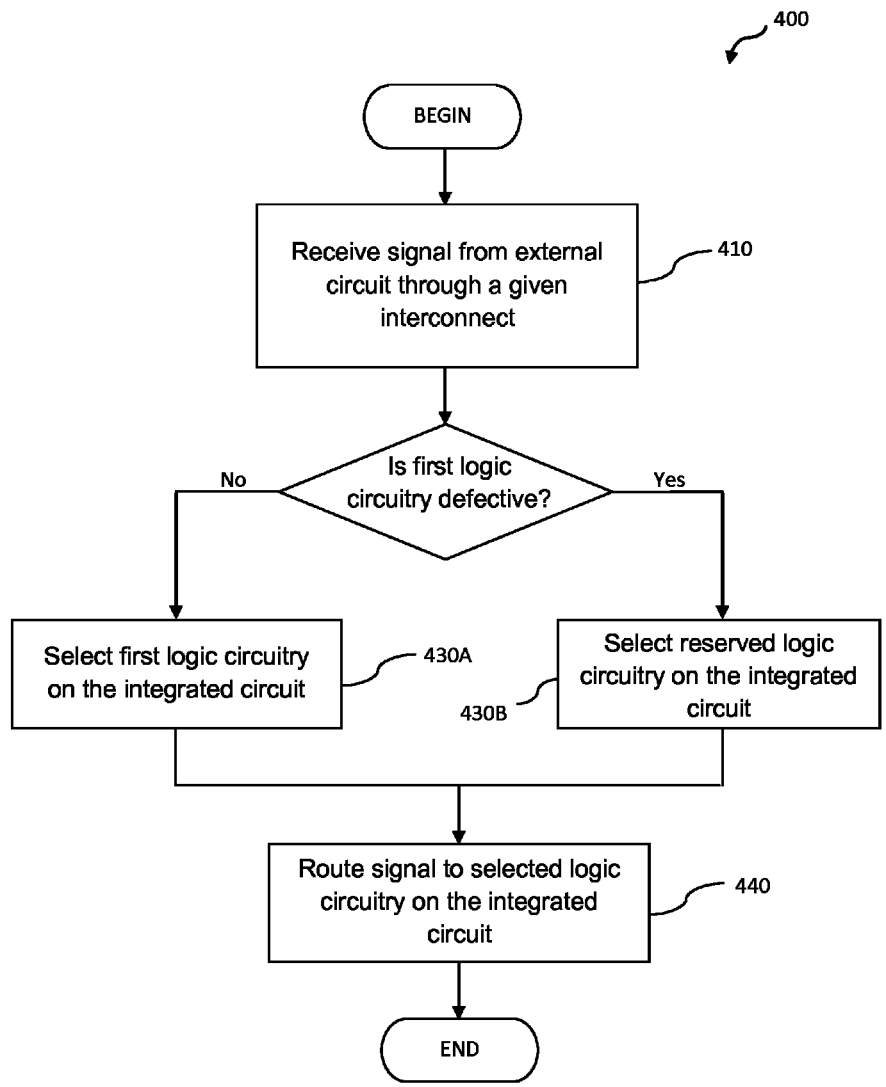
FIG. 7 is a simplified method for operating an integrated circuit that is coupled to an external integrated circuit by a plurality of interconnects in accordance with one embodiment of the present invention.

FIG. 7 illustrates a simplified method 400 for operating an integrated circuit that is coupled to an external integrated circuit by a plurality of interconnects in accordance with one embodiment of the present invention. At step 410, a signal is received from the external circuit through a given interconnect that is associated with a first logic circuitry. When the first logic circuitry is defective, the control circuitry may provide a control signal to the multiplexing circuit that directs a multiplexing circuit to route the signal from the external integrated circuit to a second logic circuitry. For example, in the embodiment of FIG. 4D, control circuitry of FIG. 4A may provide control signal 103 to multiplexing circuit 104D to route the signal from the external integrated circuit to reserved logic circuitry 111B when programmable logic circuitry 110B is defective.

If the first logic circuitry is identified as a non-defective circuitry (e.g., operational circuitry), the first logic circuitry is selected on the integrated circuit at step 430A. If the first logic circuitry is identified as a defective circuitry, a reserved logic circuitry on the integrated circuit is activated and selected at step 430B. Once a logic circuitry is selected (e.g., either the first logic circuitry or a reserved logic circuitry, the signal may be transmitted to a driver circuit, such as driver circuit 108 of FIG. 4D, that may be operable to direct the signal to a multiplexer, such as multiplexer 104D of FIG. 4D.

The signal is routed to the selected logic circuitry on the integrated circuit at step 440. In one embodiment, control circuitry (e.g., control circuitry 102 of the embodiment of FIG. 4A) may provide a control signal to a multiplexing circuit that directs the multiplexing circuit to route the received signal from the external circuit to the integrated circuit. In the exemplary embodiment of FIG. 4E, multiplexer 104D may transmit signal 109 to reserved logic circuitry 110D.

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit comprising:
    an interconnect;
    a first logic circuitry operable to produce a first signal;
    a second logic circuitry operable to produce a second signal, wherein the second logic circuitry is activated when the first logic circuitry is defective; and
    multiplexing circuit operable to receive the first and second signals and to produce an output signal selected from the first and second signals to the interconnect.

2. The integrated circuit defined in claim 1 wherein the first logic circuitry comprises a first programmable logic circuitry and wherein the second logic circuitry comprises a second programmable logic circuitry.

3. The integrated circuit defined in claim 1 further comprising:
control circuitry operable to control the multiplexing circuitry to select an output signal from the first and second signals using a control signal.

4. The integrated circuit defined in claim 3 wherein the control circuitry is operable to store information that identifies whether the first programmable logic circuitry is defective and wherein the control circuitry is operable to direct the multiplexing circuitry to select the output signal from the first and second signals based on the stored information.

5. The integrated circuit defined in claim 3 wherein the control signal comprises a static control signal and wherein the control circuitry comprises a programmable memory element that provides the static control signal.

6. The integrated circuit defined in claim 5 further comprising:
third and fourth logic circuitries, wherein the third logic circuitry comprises a third programmable logic circuitry and the fourth logic circuitry comprises a fourth programmable logic circuitry; and
an additional multiplexing circuit operable to receive an input signal from an external integrated circuit and to transmit the input signal to third and fourth logic circuitries.

7. The integrated circuit defined in claim 6 further comprising:
control circuitry that controls additional multiplexing circuit based on information stored at the control circuitry that identifies whether the third programmable logic circuitry is defective.

8. The integrated circuit defined in claim 1 wherein the interconnect is coupled to a corresponding contact pad of an external integrated circuit.

9. The integrated circuit defined in claim 8 wherein the external integrated circuit comprises an interposer.

10. The integrated circuit defined in claim 2 further comprising:
a first driver circuit operable to route the first signal from the first logic circuitry to the second logic circuitry.

11. A multi-chip package comprising:
a first integrated circuit having a first logic circuitry operable to produce a first signal, a second logic circuitry operable to produce a second signal, wherein the second logic circuitry is activated when the first logic circuitry is defective, and a multiplexing circuit operable to produce an output signal selected from the first and second signals;
a second integrated circuit; and
a plurality of interconnects coupled between the first and second integrated circuits, wherein the output signal is transmitted through a first interconnect of the plurality of interconnects to the second integrated circuit.

12. The multi-chip package defined in claim 11 wherein the second integrated circuit is disposed over the first integrated circuit, wherein the plurality of interconnects includes a plurality of contact pads on the first integrated circuit, and wherein the first interconnect includes a given bump of the plurality of bumps and a given contact pad of the plurality of contact pads.

13. The multi-chip package defined in claim 11 wherein the first integrated circuit comprises a programmable integrated circuit.

14. The multi-chip package defined in claim 11 further comprising:
an interposer wherein the second integrated circuit is placed adjacent to the first integrated circuit on the interposer.

15. The multi-chip defined in claim 11, wherein further comprising:
a control circuit coupled to the plurality of interconnects, wherein the control circuit is operable to generate the control signal and to provide the control signal to the multiplexing circuit.

16. The multi-chip package defined in claim 12, wherein the plurality of interconnects includes an interposer disposed below the first and the second integrated circuits and a plurality of bumps on the interposer.

17. A method of operating an integrated circuit that is coupled to an external integrated circuit by a plurality of interconnects, the method comprising:
with a multiplexing circuit, receiving a signal from the external integrated circuit through a given interconnect of the plurality of interconnects; and
with the multiplexing circuit, routing the signal to logic circuitry selected from first and second logic circuitry on the integrated circuit.

18. The method defined in claim 17 wherein the integrated circuit comprises a programmable integrated circuit, wherein the first logic circuitry comprises a first programmable logic circuitry, wherein the second logic circuitry comprises routing the signal to a programmable logic circuitry selected from the first and second programmable logic circuitries.

19. The method defined in claim 18 further comprising:
with control circuitry, identifying whether the first logic circuitry is defective; and
with the control circuitry, providing a control signal to the multiplexing circuit that directs the multiplexing circuit to route the signal from the external integrated circuit to the second logic circuitry in response to identifying that the first logic circuitry is defective.

20. The method defined in claim 19, wherein identifying whether the first logic circuitry is defective comprises:
receiving information from a user that identifies whether the first logic circuitry is defective.

* * * * *